(12) United States Patent
Bhosale et al.

(10) Patent No.: US 11,444,029 B2
(45) Date of Patent: Sep. 13, 2022

(54) BACK-END-OF-LINE INTERCONNECT STRUCTURES WITH VARYING ASPECT RATIOS

(71) Applicant: International Business Machines Corporation, Armonk, NY (US)

(72) Inventors: Prasad Bhosale, Albany, NY (US); Nicholas Anthony Lanzillo, Wynantskill, NY (US); Michael Rizzolo, Delmar, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/799,048

(22) Filed: Feb. 24, 2020

(65) Prior Publication Data

US 2021/0265277 A1 Aug. 26, 2021

(51) Int. Cl.
*H01L 23/532* (2006.01)
*H01L 23/538* (2006.01)
*H01L 21/768* (2006.01)

(52) U.S. Cl.
CPC .. *H01L 23/53238* (2013.01); *H01L 21/76838* (2013.01); *H01L 23/5386* (2013.01)

(58) Field of Classification Search
CPC ........... H01L 23/53238; H01L 23/5386; H01L 21/76838
See application file for complete search history.

(56) References Cited

U.S. PATENT DOCUMENTS

| | | | |
|---|---|---|---|
| 5,091,339 A * | 2/1992 | Carey | H01L 21/31144 216/18 |
| 6,586,828 B2 | 7/2003 | Buffet et al. | |
| 6,838,713 B1 | 1/2005 | Gheewala et al. | |
| 7,169,695 B2 | 1/2007 | Huang et al. | |
| 8,336,018 B2 | 12/2012 | Turner et al. | |
| 8,735,279 B2 | 5/2014 | Horak et al. | |
| 9,601,426 B1 | 3/2017 | Bonilla et al. | |
| 9,793,163 B2 | 10/2017 | Bristol et al. | |
| 10,090,244 B2 | 10/2018 | Xu et al. | |

(Continued)

OTHER PUBLICATIONS

A. Gupta et al., "High-Aspect-Ratio Ruthenium Lines for Buried Power Rail," IEEE International Interconnect Technology Conference (IITC), Jun. 4-7, 2018, pp. 4-6.

(Continued)

*Primary Examiner* — David Vu
(74) *Attorney, Agent, or Firm* — L. Jeffrey Kelly; Ryan, Mason & Lewis, LLP (57) ABSTRACT

A semiconductor structure includes an interlayer dielectric layer, a first set of back-end-of-line interconnect structures disposed in the interlayer dielectric layer, and a second set of back-end-of-line interconnect structures at least partially disposed in the interlayer dielectric layer. Each of the first set of back-end-of-line interconnect structures has a first width and a first height providing a first aspect ratio. Each of the second set of back-end-of-line interconnect structures has a second width and a second height providing a second aspect ratio different than the first aspect ratio. The second width is greater than the first width, and the second height is different than the first height.

13 Claims, 6 Drawing Sheets

(56) References Cited

U.S. PATENT DOCUMENTS

2013/0093092 A1* 4/2013 Kanki ............... H01L 21/76877
  257/758
2021/0035907 A1* 2/2021 Chen ................. H01L 21/76843

OTHER PUBLICATIONS

D. Wan et al., "Subtractive Etch of Ruthenium for Sub-5nm Interconnect," IEEE International Interconnect Technology Conference (IITC), Jun. 4-7, 2018, pp. 10-12.

* cited by examiner

BACK-END-OF-LINE INTERCONNECT STRUCTURES WITH VARYING ASPECT RATIOS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming back-end-of-line interconnect structures with varying aspect ratios.

In one embodiment, a semiconductor structure comprises an interlayer dielectric layer, a first set of back-end-of-line interconnect structures disposed in the interlayer dielectric layer, and a second set of back-end-of-line interconnect structures at least partially disposed in the interlayer dielectric layer. Each of the first set of back-end-of-line interconnect structures has a first width and a first height providing a first aspect ratio. Each of the second set of back-end-of-line interconnect structures has a second width and a second height providing a second aspect ratio different than the first aspect ratio, the second width being greater than the first width, the second height being different than the first height.

In another embodiment, an integrated circuit comprises a semiconductor structure comprising an interlayer dielectric layer, a first set of back-end-of-line interconnect structures disposed in the interlayer dielectric layer, and a second set of back-end-of-line interconnect structures at least partially disposed in the interlayer dielectric layer. Each of the first set of back-end-of-line interconnect structures has a first width and a first height providing a first aspect ratio. Each of the second set of back-end-of-line interconnect structures has a second width and a second height providing a second aspect ratio different than the first aspect ratio. The second width is greater than the first width, and the second height is different than the first height.

In another embodiment, a method of forming a semiconductor structure comprises forming a first set of back-end-of-line interconnect structures in an interlayer dielectric layer and forming a second set of back-end-of-line interconnect structures at least partially in the interlayer dielectric layer. Each of the first set of back-end-of-line interconnect structures has a first width and a first height providing a first aspect ratio. Each of the second set of back-end-of-line interconnect structures has a second width and a second height providing a second aspect ratio different than the first aspect ratio. The second width is greater than the first width, and the second height is different than the first height.

DETAILED DESCRIPTION

Illustrative embodiments of the invention may be described herein in the context of illustrative methods for forming back-end-of-line interconnect structures with varying aspect ratios, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

Back-end-of-line (BEOL) interconnect structures may use a wide range of critical dimension (CD). BEOL interconnect structures may be formed using copper (Cu). As the metal CD goes down, however, the conductivity of Cu drops. Accordingly, there is a need for the use of alternate materials for forming BEOL interconnect structures as devices continue to scale. Alternate materials, such as cobalt (Co) can match Cu effective resistivity (resistance and area product) as devices continue to scale to 30 nm pitch and below with a minimal capacitance loss. BEOL interconnects or lines may include "narrow" and "wide" lines, where the wide lines are three times (3×), five times (5×), ten times (10×), etc. the width of the narrow lines. Although Co can match the effective resistivity of Cu, wide line resistance with Co remains high which can negatively impact device performance. For 3× wide lines, for example, the use of Co rather than Cu results in about a 4% performance penalty.

Illustrative embodiments provide techniques for forming BEOL lines and interconnects (e.g., including power rails) which selectively increase the aspect ratio of the wide lines. Since capacitance scales linearly but resistance scales exponentially, the impact on overall performance can be minimized. In some embodiments, aspect ratio is only increased on the wide lines and the narrow lines keep an original aspect ratio. The area cover by wide power lines (e.g., 3×, 5×, etc.) is less than the minimum pitch lines at the same level. This will limit the impact on total performance. In some embodiments, BEOL interconnect structures are formed where a different aspect ratio is used for each "type" of line (e.g., the aspect ratio changes with critical dimension (CD)). Such BEOL interconnect structures may be formed with a dual damascene structure with different aspect ratios formed using a wide line first processing flow. Such BEOL interconnect structures may alternatively be formed using a subtractive etch process flow that increases the line aspect ratio selectively on wide lines. Advantageously, illustrative embodiments selectively increase the aspect ratio without changing the width of the power rails, lines or other BEOL interconnect structures.

Figure 1:
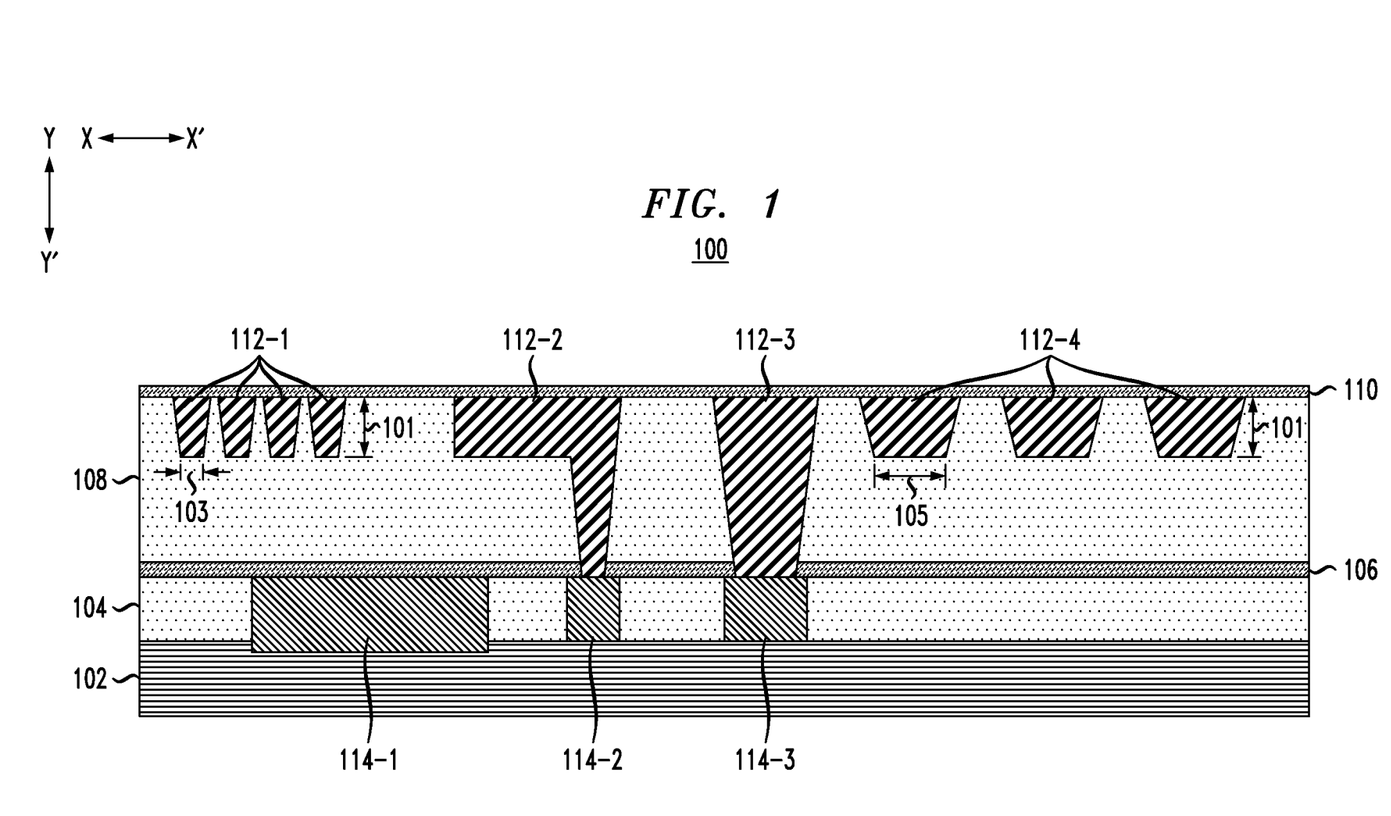
FIG. 1 depicts a side cross-sectional view of a structure with back-end-of-line interconnect structures that have a same depth for narrow and wide lines, according to an embodiment of the invention.

FIG. 1 shows a side cross-sectional view 100 of a structure that includes a substrate 102, an interlayer dielectric (ILD) layer 104, a capping layer 106, an ILD layer 108, a capping layer 110, interconnect structures 112-1, 112-2, 112-3 and 112-4 (collectively, interconnect structures 112), and contacts 114-1, 114-2 and 114-3 (collectively, contacts 114).

The substrate 102 may comprise a semiconductor substrate formed of silicon (Si), although other suitable materials may be used. For example, the substrate 102 can include any suitable substrate structure, e.g., a bulk semiconductor. The substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The size of the substrate 102 may vary, such as based on the number of transistors or other device features that will be formed thereon.

The ILD layer 104 may be formed of silicon dioxide ($SiO_2$) or another silicon oxide ($SiO_x$), silicon oxynitride (SiON), silicon oxycarbide (SiOC), etc. The ILD layer 104 may also comprise an ultra low-k dielectric material (e.g., a material with a dielectric constant less than that of $SiO_2$). The ILD layer 104 may have a height or vertical thickness (in direction Y-Y') in the range of about 10 to 100 nanometers (nm).

The capping layer 106 may be formed of silicon nitride (SiN) or another suitable material such as silicon boron nitride (SiBN), silicon carbon oxygen hydrogen (SiCOH), etc. The capping layer 106 may have a height or vertical thickness (in direction Y-Y') in the range of 2 to 20 nm.

The ILD layer 108 may be formed of similar materials as the ILD layer 104. The ILD layer 108 may have a height or vertical thickness (in direction Y-Y') in the range of about 10 to 100 nm.

The capping layer 110 may be formed of similar materials as the capping layer 106. The capping layer 110 may have a height or vertical thickness (in direction Y-Y') in the range of about 2 to 20 nm.

The interconnect structures 112 may be formed of Cu, and include a set of narrow lines 112-1 and a set of wide lines 112-4. The narrow lines 112-1 and wide lines 112-4 may have a same height 101 in the range of about 10 to 50 nm. The narrow lines 112-1 each have a width 103 in the range of about 5 to 50 nm, and the wide lines 112-4 each have a width 105 that is about 10 to 100 nm. More generally, the width 105 of the wide lines 112-4 in some embodiments is at least double the width 103 of the narrow lines 112-1. In some embodiments, the width 105 of the wide lines 112-4 is ten times the width 103 of the narrow lines 112-1.

The interconnect structures 112 also include an interconnect structure 112-2 to contact 114-2 and an interconnect structure 112-3 to contact 114-3. The interconnect structures 112-2 and 112-3 may have widths that approximately match the dimension of the underlying contacts 114-2 and 114-3.

The contacts 114 include a first contact 114-1, a second contact 114-2, and a third contact 114-3. The first contact 114-1 in this embodiment is assumed to be a connection to a transistor (e.g., a fin-type field-effect transistor or FinFET), and may be formed of tungsten (W), Co or another suitable material. The first contact 114-1 may have a width or horizontal thickness (in direction X-X') that approximately matches the width 103 of the narrow lines 112-1 (e.g., in the range of about 5 to 50 nm), and a height or vertical thickness (in direction Y-Y') that substantially or approximately matches the height or vertical thickness of the ILD layer 104. The second contact 114-2 is assumed to be a contact to a transistor (e.g., a FinFET), and may be formed of tungsten (W), cobalt (Co), ruthenium (Ru), etc. The second contact 114-2 may have a width or horizontal thickness (in direction X-X') in the range of about 5 to 50 nm, and a height or vertical thickness (in direction Y-Y') that substantially or approximately matches the height or vertical thickness of the ILD layer 104. The third contact 114-3 is assumed to be a contact to a transistor (e.g., a FinFET), and may be formed of W, Co, Ru, etc. The second contact 114-3 may have a width or horizontal thickness (in direction X-X') in the range of about 5 to 50 nm, and a height or vertical thickness (in direction Y-Y') that substantially or approximately matches the height or vertical thickness of the ILD layer 104.

Consider, as an example, a nine transistor (9T) vertical transport field-effect transistor (VTFET) structure, with 4-finger FO2 and a 40%/60% ratio of Mx/Fx. 4-finger refers to the size of the device (e.g., the number of fins), and FO2 refers to a fan-out of two such that the output of one transistor drives the input of another transistor. The wide lines 112-4, in this example, are assumed to be 3× the width of the narrow lines 112-1. The maximum frequency relative to Cu versus the ratio of Co to Cu interconnect or via resistance indicates that, depending on the ratio of Co via resistance, the performance is within about 3%. The use of Co as a conductor as a conductor for the BEOL interconnect structures results in an approximate 4% performance penalty relative to Cu.

Figure 2:
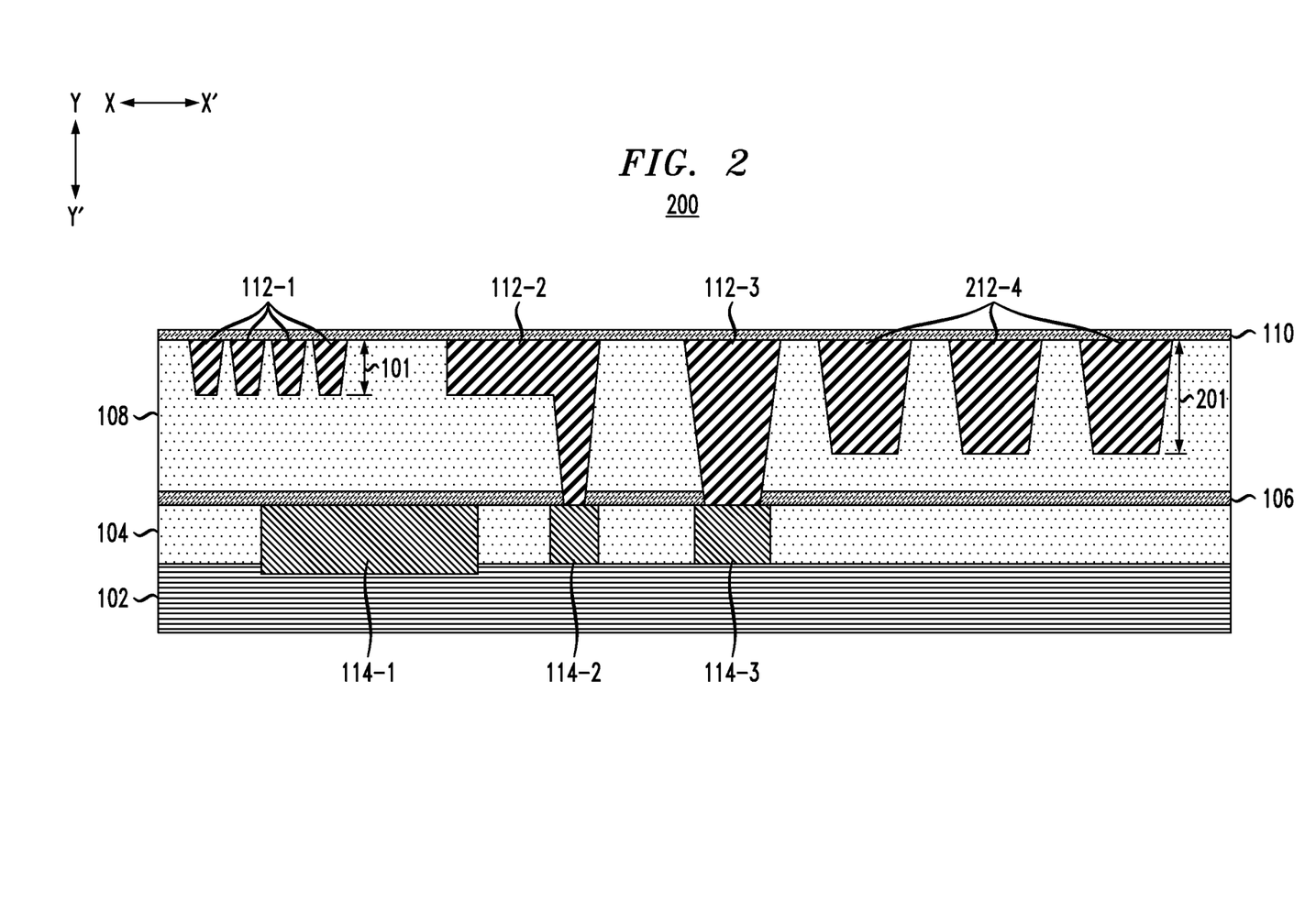
FIG. 2 depicts a side cross-sectional view of a structure with back-end-of-line interconnect structures having different aspect ratios for narrow and wide lines, according to an embodiment of the invention.

FIG. 2 shows a side cross-sectional view 200 of a structure that is similar to the structure of FIG. 1, with the exception of the aspect ratio of the wide lines 212-4. Whereas in the FIG. 1 structure both the narrow lines 112-1 and wide lines 112-4 had the same height 101, the wide lines 212-4 in the FIG. 2 structure have an increased height 201 of about twice the height of the narrow lines 112-1 (e.g., height 201 is approximately 2× height 101). The line resistance-capacitance (RC) versus the height increase for the wide lines 212-4 (e.g., where the wide lines 212-4 in this example are assumed to comprise 3× wide lines) has a minimal impact on performance due to the capacitance scaling linearly while the resistance scales exponentially. This provides about 30% performance benefits.

Line resistance and effective resistivity versus trench area, respectively, for BEOL interconnect structures formed of Co and Cu at 30 nm pitch, using a barrier layer of titanium nitride (TiN) or tantalum nitride (TaN) formed using atomic layer deposition (ALD) indicate that Co metallization can match Cu effective resistivity at 30 nm pitch or below. Wide line resistance (e.g., for 3×, 5×, 10× wide lines), however, remains high which can negatively impact overall device performance.

To overcome this issue, illustrative embodiments selectively increase line trench height for the BEOL interconnect structures to compensate for these effects (e.g., selectively increasing wide line trench height 201 to compensate for higher wide line 212-4 resistance). If, for example, 3× wide line resistance is too high (e.g., as specified by device performance requirements), then the line height can be increased in order to meet the line resistance target for the specified device performance requirements. As noted above, this comes at the expense of capacitance. Since capacitance scales linearly while resistance scales exponentially, the overall impact on performance can be minimized. This is illustrated by considering line resistance versus line height increase for BEOL interconnect structures (e.g., for Co BEOL interconnect structures formed using chemical vapor deposition (CVD) at three additional thicknesses relative to minimum pitch Cu BEOL interconnect structures—2 nm, 4 nm and 6 nm). This is further illustrated by considering total capacitance versus line height increase for BEOL interconnect structures (e.g., for 3× wide lines with 1× and 3× spacing).

It should be noted that in some embodiments, the aspect ratio is only increased on the wide lines and that the narrow lines can remain at the lower aspect ratio. This is shown in the structure of FIG. 2, where the narrow lines 112-1 maintain an original aspect ratio while the wide lines 212-4 have an increased aspect ratio by doubling the line height 201 relative to height 101.

Figure 3:
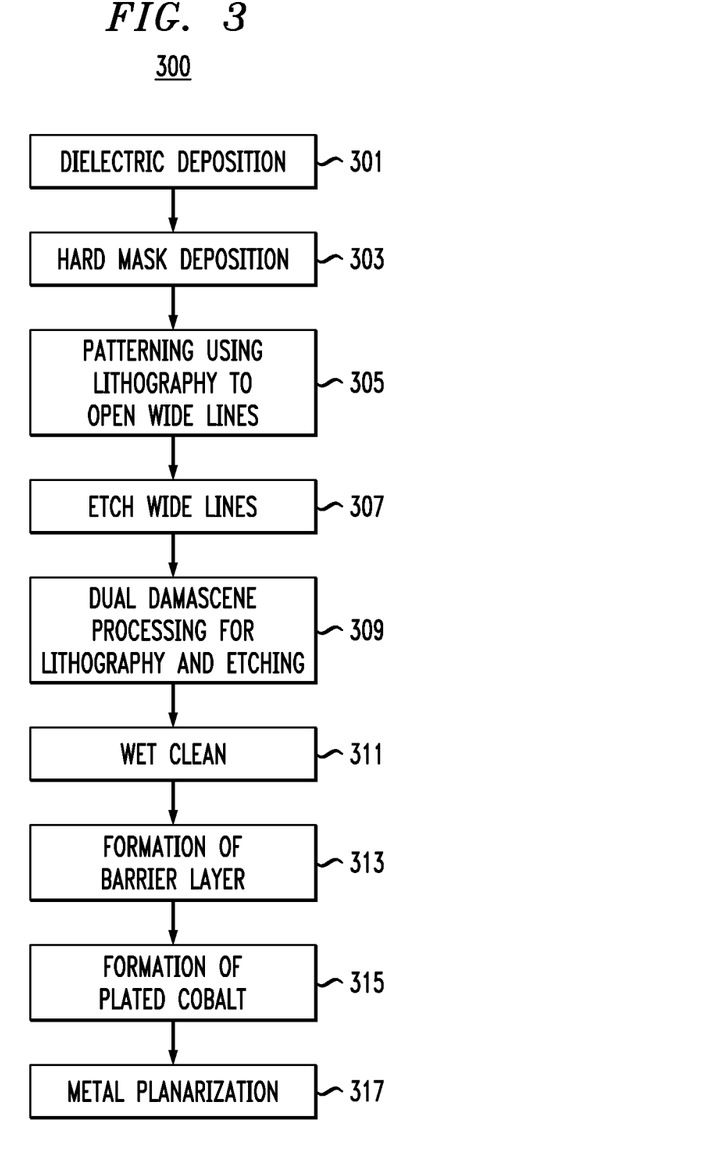
FIG. 3 depicts a process flow for selectively increasing line aspect ratio for back-end-of-line interconnect structures using reactive-ion etching and patterning, according to an embodiment of the invention.

FIG. 3 shows a process 300 for forming the FIG. 2 structure. The process begins with depositing a dielectric (e.g., material for the ILD layer 108) in step 301. Next, a hard mask is deposited in step 303. The hard mask may be formed of titanium nitride (TiN), silicon nitride (SiN), tantalum nitride (TaN) or another suitable material using any suitable deposition process (e.g., chemical vapor deposition (CVD), physical vapor deposition (PVD), atomic layer deposition (ALD), etc.). The hard mask may have a height or vertical thickness (in direction Y-Y') in the range of several hundred nanometers. The hard mask is then patterned in step 305 using lithography to form openings for the wide lines 212-4. In step 307, the dielectric material deposited in step 301 (e.g., which will form the ILD layer 108 in the completed structure) is etched (e.g., using reactive-ion etching (ME)) to form the trenches for the wide lines 212-4. In step 309, dual damascene processing including lithography and etching is performed to form vias for the lines 112-2 and 112-3. The narrow lines 112-1 are patterned and etched after the wide lines 112-4 are formed. Next, a wet clean is performed in step 311 followed by formation of a barrier layer in step 313. The barrier layer may comprise TiN, TaN or another suitable material such as cobalt-tungsten (CoW), tantalum (Ta) in both alpha and beta phases, etc. The barrier layer is a thin layer (e.g., with a thickness in the range of about 1 to 10 nm) that lines the trenches and vias formed in the dielectric material that provides the ILD layer 108 to prevent diffusion of the metal material (e.g., Co) that is later plated in step 315. In some embodiments, Cu is the primary element that the barrier layer seeks to restrict the diffusion of, and diffusion of Co is secondary to Cu diffusion. The barrier layer may be formed using ALD, physical vapor deposition (PVD) or another suitable process. In step 317, metal chemical-mechanical planarization (CMP) is performed to remove any metal material (e.g., Co) that is plated above a top surface of the dielectric material deposited in step 301.

Figure 4:
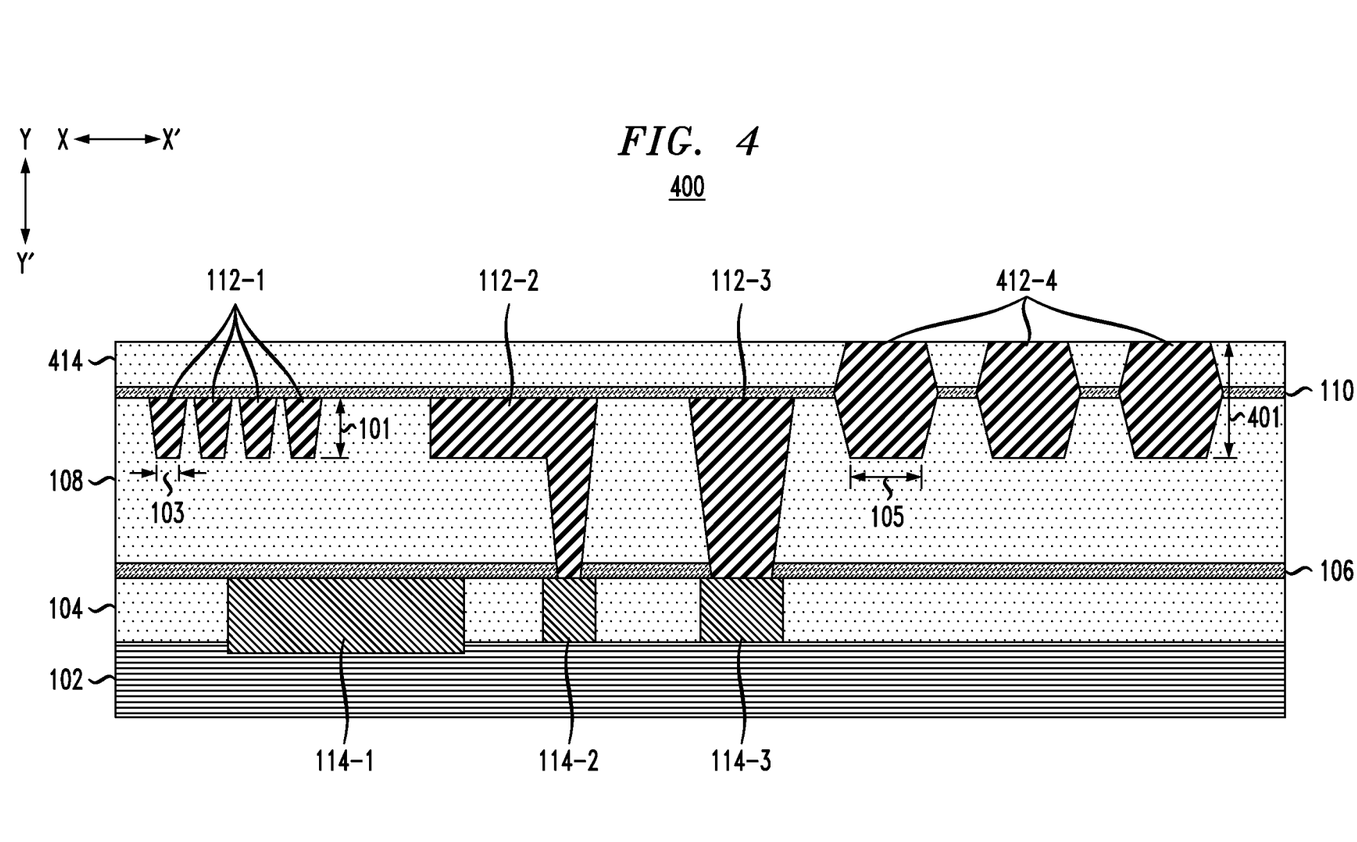
FIG. 4 depicts a side cross-sectional view of a structure with back-end-of-line interconnect structures having different aspect ratios formed using a subtractive etch process, according to an embodiment of the invention.

FIG. 4 shows a side cross-sectional view 400 of a structure that is similar to the structure of FIG. 1, but with an additional ILD layer 414 formed over the capping layer 110 and the wide lines 412-4 being formed through the ILD layer 414 and capping layer to achieve an increased aspect ratio relative to the narrow lines 112-1. Similar to the structure of FIG. 2, the wide lines 412-4 in the FIG. 4 structure have an increased height 401 of about twice the height 101 of the narrow lines 112-1. The narrow lines 112-1 and the portions of the wide lines 412-4 below the capping layer 110 are formed using a damascene process, and the additional height of the wide lines 412-4 in the ILD layer 414 is formed using a subtractive etch process, an example of which will be described below with respect to FIG. 5. The wide lines 412-4, as illustrated in FIG. 4, have a hexagonal shape.

Figure 5:
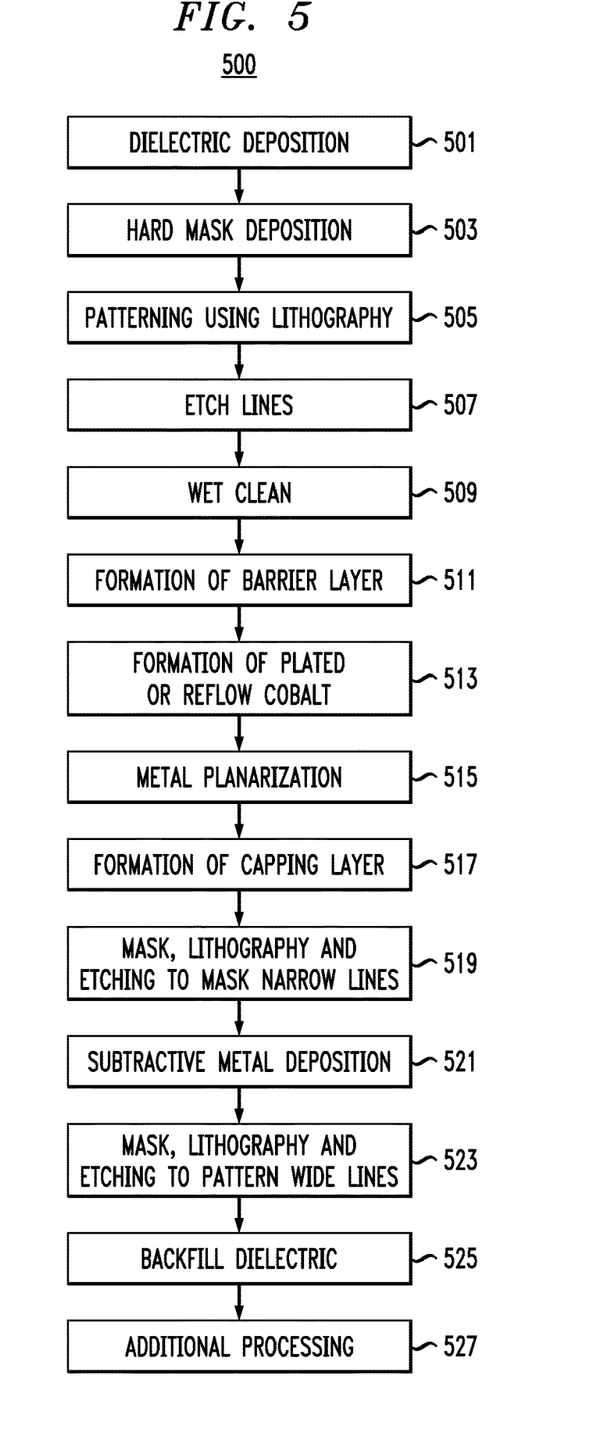
FIG. 5 depicts a process flow for selectively increasing line aspect ratio for back-end-of-line interconnect structures using subtractive etching, according to an embodiment of the invention.

FIG. 5 shows a process flow 500 for forming the wide lines 412-4 in the FIG. 4 structure using subtractive etching. In step 501, a dielectric material is deposited (e.g., which will form the ILD layer 108 in the completed structure). Next, a hard mask is deposited in step 503 (e.g., using materials and processing similar to that described above in conjunction with step 303 of process flow 300). The hard mask is patterned using lithography in step 505 to form openings for the narrow lines 112-1 and wide lines 412-4. The dielectric material is then etched in step 507 (e.g., using RIE) to form trenches for the narrow lines 112-1 and wide lines 412-4 in the dielectric material that forms the ILD layer 108 of the completed structure. A wet clean is performed in step 509, followed by formation of a barrier layer in step 511. Plated or reflow Co is then formed in step 513, followed by planarization (e.g., using CMP) in step 515. Steps 509, 511, 513 and 515 are similar to steps 311, 313, 315 and 317 of process flow 300. In step 517, the capping layer 110 is formed.

Mask, lithography and etch processing for the narrow lines 112-1 is performed in step 519. The mask, lithography and etch processing removes the capping layer from the wide lines 412-4 selective to the narrow lines 112-1. Subtractive metal deposition is then performed in step 521. This includes depositing metal material (e.g., Co) that will be used to form portions of the wide lines 412-4. Mask, lithography and etch processing for the wide lines 412-4 is then performed in step 523. This may include formation of a hard mask over the metal material formed in step 521, followed by patterning the hard mask using lithography such that the hard mask remains only where the narrow lines 412-4 are to be formed. The exposed metal material is then etched or subtracted (e.g., using a chlorine-based (Cl-based) or fluorine-based (F-based) chemistry) such that the remaining metal material provides the portions of the wide lines 412-4 above the capping layer 110. In step 525, a dielectric material is backfilled to form the ILD layer 414. In some embodiments, a thin diffusion barrier or adhesion layer (e.g., formed of TiN, TaN, Ta, etc.) is formed around the subtractively formed metal prior to backfill of the dielectric material to form the ILD layer 414. The process flow may then proceed with additional processing 527 (e.g., planarization, etc.).

Figure 6:
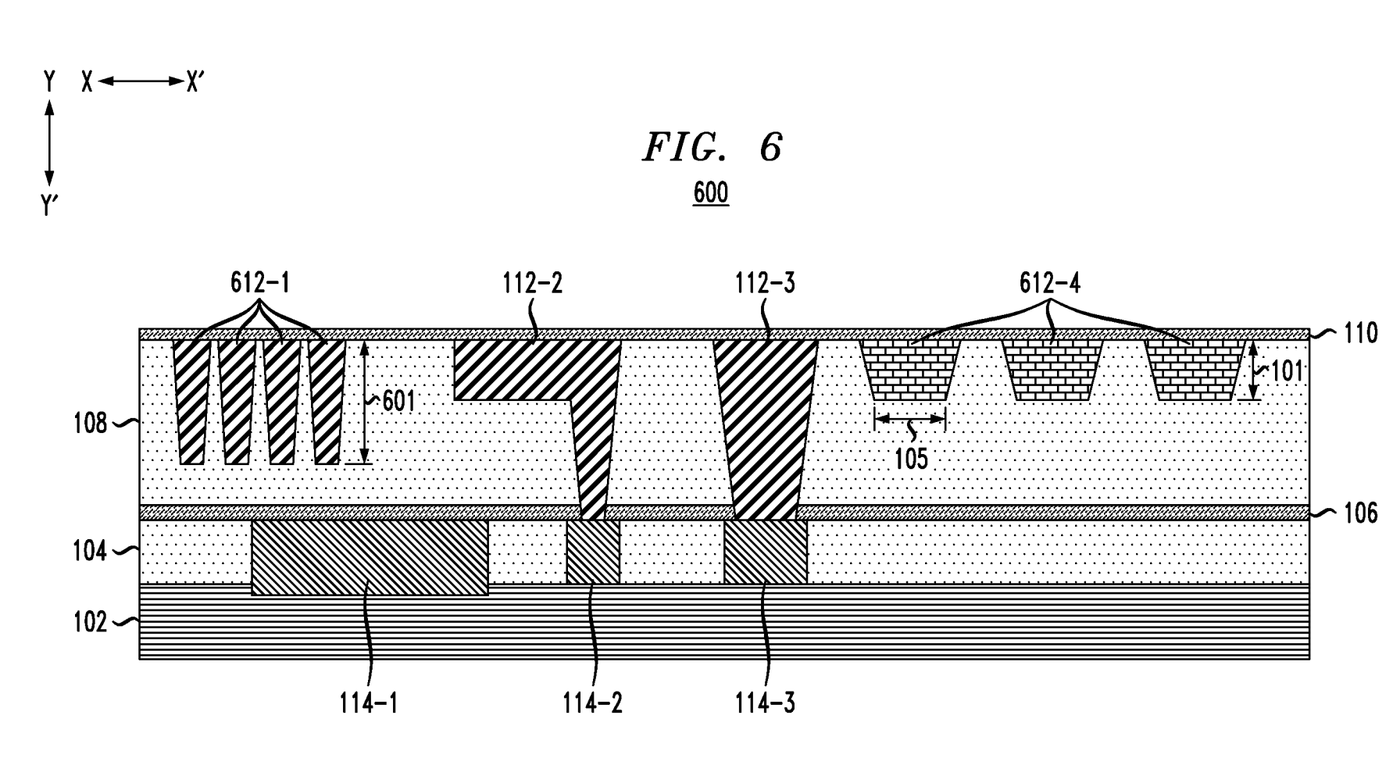
FIG. 6 depicts a side cross-sectional view of a structure with back-end-of-line interconnect structures having different aspect ratios, according to an embodiment of the invention.

FIG. 6 shows a side cross-sectional view 600 of a structure that is similar to the structure of FIG. 1, but where different materials are used for the narrow lines 612-1 and the wide lines 612-4, and where the aspect ratio of the narrow lines 612-1 is increased while the wide lines 612-4 retain the original aspect ratio (e.g., the wide lines 612-4 have the same height 101 as the wide lines 112-4 in the FIG. 1 structure). In the FIG. 6 structure, the narrow lines 612-1 use a first metal material (e.g., Co) and the wide lines 612-4 use a second metal material (e.g., Cu) different than the first metal material. The narrow lines 612-1 have an increased height 601 (e.g., which is approximately twice the height 101 of narrow lines 112-1 in the FIG. 1 structure). The lines 112-2 and 112-3 may be use the first material (e.g., Co), or another material different than Cu such as ruthenium (Ru), molybdenum (Mo), rhodium (Rh), iridium (Ir), etc.

While the structures of FIGS. 2 and 4 are well suited for devices that are scaling to 7 nm and beyond, the structure of FIG. 6 is well suited for "legacy" devices that utilize 14 nm nodes or for 12 nm nodes where there is a performance difference enabled. It should be appreciated, however, that the structures of FIGS. 2, 4 and 6 may be used as desired for different sized nodes (e.g., the structures of FIGS. 2 and 4, for example, need not be used exclusively for devices with 7 nm and smaller nodes). The choice of whether to use the structure of FIG. 2, 4 or 6 may be based on the circuit design for a particular implementation and how much value or space there is for using the different structures.

The FIG. 6 structure may be formed using a processing flow similar to that described above with respect to FIG. 3, but where the processing described is used to form the increased aspect ratio of the narrow lines 612-1 rather than the wide lines 212-4 (e.g., steps 305 and 307 are changed to patterning and etching the narrow or minimum pitch lines rather than etching the wide lines).

In some embodiments, a semiconductor structure comprises an ILD layer, a first set of BEOL interconnect structures disposed in the ILD layer, and a second set of BEOL interconnect structures at least partially disposed in the ILD layer. Each of the first set of BEOL interconnect structures has a first width and a first height providing a first aspect ratio. Each of the second set of BEOL interconnect structures has a second width and a second height providing a second aspect ratio different than the first aspect ratio, the second width being greater than the first width, the second height being different than the first height.

The first set of BEOL interconnect structures and the second set of BEOL interconnect structures may comprise a given metal material, and the second height may be greater than the first height. The given metal material may comprise Co. The second set of BEOL interconnect structures may be fully disposed in the ILD layer. The second height may be about twice the first height, and the second width may be about three times the first width or greater.

The semiconductor structure may further comprise a capping layer disposed over the ILD layer and an additional ILD layer disposed over the capping layer. Each of the second set of BEOL interconnect structures may comprise a first portion disposed in the ILD layer and a second portion disposed in the additional ILD layer. The first portion of each of the second set of BEOL interconnect structures may have the first height. Each of the second set of BEOL interconnect structures may have a hexagonal shape.

The first set of BEOL interconnect structures may comprise a first metal material and the second set of BEOL interconnect structures may comprise a second metal material different than the first metal material, and the first height may be greater than the second height. The first metal material may comprise Co and the second metal material may comprise Cu. The first height may be about twice the second height, and the second width may be about three times the first width or greater.

In some embodiments, an integrated circuit comprises a BEOL interconnect network comprising an ILD layer, a first set of BEOL interconnect structures disposed in the ILD layer, and a second set of BEOL interconnect structures at least partially disposed in the ILD layer. Each of the first set of BEOL interconnect structures has a first width and a first height providing a first aspect ratio. Each of the second set of BEOL interconnect structures has a second width and a second height providing a second aspect ratio different than the first aspect ratio. The second width is greater than the first width, and the second height is different than the first height.

The first set of BEOL interconnect structures and the second set of BEOL interconnect structures may comprise Co, and the second height may be greater than the first height.

The first set of BEOL interconnect structures may comprise Co and the second set of BEOL interconnect structures may comprise Cu, and the first height may be greater than the second height.

In some embodiments, a method of forming a semiconductor structure comprises forming a first set of BEOL interconnect structures in an ILD layer and forming a second set of BEOL interconnect structures at least partially in the ILD layer. Each of the first set of BEOL interconnect structures has a first width and a first height providing a first aspect ratio. Each of the second set of BEOL interconnect structures has a second width and a second height providing a second aspect ratio different than the first aspect ratio. The second width is greater than the first width, and the second height is different than the first height.

The first set of BEOL interconnect structures and the second set of BEOL interconnect structures may comprise a given metal material, and the second height may be greater than the first height.

Forming the first set of BEOL interconnect structures and forming the second set of BEOL interconnect structures may comprise using a dual damascene process that forms trenches in the ILD layer for the second set of BEOL interconnect structures prior to forming trenches in the ILD layer for the first set of BEOL interconnect structures.

Forming the first set of BEOL interconnect structures and forming the second set of BEOL interconnect structures may comprise forming the first set of BEOL interconnect structures and a first portion of each of the second set of BEOL interconnect structures using a damascene process that forms trenches in the ILD layer for the first set of BEOL interconnect structures and the first portion of each of the second set of BEOL interconnect structures at a same time, forming a capping layer over the ILD layer, and forming a second portion of each of the second set of BEOL interconnect structures in an additional ILD layer formed over the capping layer using a subtractive etch process.

The first set of BEOL interconnect structures comprise a first metal material and the second set of BEOL interconnect structures may comprise a second metal material different than the first metal material, and the first height may be greater than the second height.

Forming the first set of BEOL interconnect structures and forming the second set of BEOL interconnect structures may comprise selecting the first aspect ratio for the first set of BEOL interconnect structures based at least in part on the first width and selecting the second aspect ratio for the second set of BEOL interconnect structures based at least in part on the second width.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein.

In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   an interlayer dielectric layer;
   a first set of back-end-of-line interconnect structures disposed in the interlayer dielectric layer; and
   a second set of back-end-of-line interconnect structures at least partially disposed in the interlayer dielectric layer;
   wherein each of the first set of back-end-of-line interconnect structures has a first aspect ratio, the first aspect ratio being defined by a first width at a bottom surface of each of the first set of back-end-of-line interconnect structures and a first height measured from a top surface of each of the first set of back-end-of-line interconnect structures to the bottom surface of each of the first set of back-end-of-line interconnect structures;
   wherein each of the second set of back-end-of-line interconnect structures has a second aspect ratio different than the first aspect ratio, the second aspect ratio being defined by a second width at a bottom surface of each of the second set of back-end-of-line interconnect structures and a second height measured from a top surface of each of the second set of back-end-of-line interconnect structures to the bottom surface of each of the second set of back-end-of-line interconnect structures;
   wherein the second width is greater than the first width and the second height is greater than the first height;
   wherein sidewalls of each of the first set of back-end-of-line interconnect structures have a first constant sidewall taper angle such that the first width at the bottom surface of each of the first set of back-end-of-line interconnect structures is less than a third width at the top surface of each of the first set of back-end-of-line interconnect structures; and
   wherein sidewalls of each of the second set of back-end-of-line interconnect structures have a second constant sidewall taper angle such that the second width at the bottom surface of each of the second set of back-end-of-line interconnect structures is less than a fourth width at the top surface of each of the second set of back-end-of-line interconnect structures.

2. The semiconductor structure of claim 1, wherein the first set of back-end-of-line interconnect structures and the second set of back-end-of-line interconnect structures comprise a given metal material.

3. The semiconductor structure of claim 2, wherein the given metal material comprises cobalt (Co).

4. The semiconductor structure of claim 2, wherein the second height is about twice the first height, and wherein the second width is about three times the first width or greater.

5. The semiconductor structure of claim 1, wherein the second set of back-end-of-line interconnect structures is fully disposed in the interlayer dielectric layer.

6. The semiconductor structure of claim 1, wherein the second height is a function of a line resistance target for the second set of back-end-of-line interconnect structures.

7. The semiconductor structure of claim 6, wherein the line resistance target for the second set of back-end-of-line interconnect structures is based at least in part on one or more device performance requirements.

8. An integrated circuit comprising:
a semiconductor structure comprising:
an interlayer dielectric layer;
a first set of back-end-of-line interconnect structures disposed in the interlayer dielectric layer; and
a second set of back-end-of-line interconnect structures at least partially disposed in the interlayer dielectric layer;
wherein each of the first set of back-end-of-line interconnect structures has a first aspect ratio, the first aspect ratio being defined by a first width at a bottom surface of each of the first set of back-end-of-line interconnect structures and a first height measured from a top surface of each of the first set of back-end-of-line interconnect structures to the bottom surface of each of the first set of back-end-of-line interconnect structures;
wherein each of the second set of back-end-of-line interconnect structures has a second aspect ratio different than the first aspect ratio, the second aspect ratio being defined by a second width at a bottom surface of each of the second set of back-end-of-line interconnect structures and a second height measured from a top surface of each of the second set of back-end-of-line interconnect structures to the bottom surface of each of the second set of back-end-of-line interconnect structures;
wherein the second width is greater than the first width and the second height is greater than the first height;
wherein sidewalls of each of the first set of back-end-of-line interconnect structures have a first constant sidewall taper angle such that the first width at the bottom surface of each of the first set of back-end-of-line interconnect structures is less than a third width at the top surface of each of the first set of back-end-of-line interconnect structures; and
wherein sidewalls of each of the second set of back-end-of-line interconnect structures have a second constant sidewall taper angle such that the second width at the bottom surface of each of the second set of back-end-of-line interconnect structures is less than a fourth width at the top surface of each of the second set of back-end-of-line interconnect structures.

9. The integrated circuit of claim 8, wherein the first set of back-end-of-line interconnect structures and the second set of back-end-of-line interconnect structures comprise cobalt (Co).

10. The integrated circuit of claim 8, wherein the second height is a function of a line resistance target for the second set of back-end-of-line interconnect structures.

11. The integrated circuit of claim 10, wherein the line resistance target for the second set of back-end-of-line interconnect structures is based at least in part on one or more device performance requirements.

12. The integrated circuit of claim 8, wherein the second set of back-end-of-line interconnect structures is fully disposed in the interlayer dielectric layer.

13. The integrated circuit of claim 8, wherein the second height is about twice the first height, and wherein the second width is about three times the first width or greater.

* * * * *